(12) United States Patent
Narita et al.

(10) Patent No.: US 6,943,427 B2
(45) Date of Patent: Sep. 13, 2005

(54) SEMICONDUCTOR DEVICE FOR CHARGE-UP DAMAGE EVALUATION AND CHARGE-UP DAMAGE EVALUATION METHOD

(75) Inventors: Kenji Narita, Ibaraki (JP); Takao Yamaguchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 46 days.

(21) Appl. No.: 10/769,770

(22) Filed: Feb. 3, 2004

(65) Prior Publication Data

US 2004/0166682 A1 Aug. 26, 2004

(30) Foreign Application Priority Data

Feb. 20, 2003 (JP) ........................................ 2003-042352

(51) Int. Cl.[7] .............................................. H01L 29/00
(52) U.S. Cl. ........................................ 257/535; 257/532
(58) Field of Search ................................ 257/300, 532, 257/535

(56) References Cited

U.S. PATENT DOCUMENTS

2002/0000579 A1 * 1/2002 Aoyama ...................... 257/211
2002/0179249 A1 * 12/2002 Morimoto ............... 156/345.46
2003/0077883 A1 * 4/2003 Ohtake ........................ 438/478

FOREIGN PATENT DOCUMENTS

JP          08203971         8/1996

* cited by examiner

Primary Examiner—Ngân V. Ngô
(74) Attorney, Agent, or Firm—Stevens, Davis, Miller & Mosher, LLP

(57) ABSTRACT

A semiconductor device for charge-up damage evaluation and an evaluation method for the same are provided which permit to detect charge-up damage caused by static electricity. There are provided a silicon substrate 9, a first insulation film 10 formed on the silicon substrate 9, a first conductive layer 6 formed on the first insulation film 10 and connected to the silicon substrate 9, a second insulation film 11 formed on the first conductive layer 6, a second conductive layer 8 formed on the second insulation film 11 and serving as an antenna, and a third insulation film 12 formed on the second conductive layer 8.

11 Claims, 11 Drawing Sheets

PARALLEL TO PULLING-UP DIRECTION

PERPENDICULAR TO PULLING-UP DIRECTION

SEMICONDUCTOR DEVICE FOR CHARGE-UP DAMAGE EVALUATION AND CHARGE-UP DAMAGE EVALUATION METHOD

BACKGROUND OF THE INVENTION

1. Field of the Invention

The present invention relates to a semiconductor device for charge-up damage evaluation and a charge-up damage evaluation method for use during steps of manufacturing semiconductor devices.

2. Description of the Related Art

As patterns of elements have become finer and denser, gate oxide films and wires of MOS transistors and the like are becoming finer. Hence, it is increasingly important to prevent damage upon an oxide film owing to charge-up during a semiconductor manufacturing process. Charge-up damage upon a thin oxide film during an ion beam irradiation process, such as ion implantation, or at a dry etching step using plasma has been a problem, and therefore, an antenna-mounted MOS (Metal Oxide Semiconductor) capacitor as that shown in FIG. 11 has been used for evaluation of charge-up damage (See Japanese Patent Application Laid-Open Gazette No. H8-203971 (pages 2 to 3) for instance.).

In FIG. 11, denoted at 101 is a silicon substrate, denoted at 102 is a thin-film gate oxide film which will serve as a capacitor area, denoted at 103 is an element isolation oxide film, and denoted at 104 is a polysilicon film which will serve as an antenna electrode. In an antenna-mounted MOS capacitor structure, the element isolation oxide film 103 is formed on the silicon substrate 101, the thin-film gate oxide film 102 is then deposited, and the polysilicon film 104 is deposited on the entire surface. In general, an antenna-mounted MOS capacitor comprises at a logarithmic ratio a plurality of capacitors whose antenna ratio:A (A=antenna electrode surface/capacitor surface) varies from 1 to $10^6$ times.

In a method of evaluating charge-up damage in this antenna-mounted MOS capacitor, the antenna-mounted MOS capacitor is processed by ion implantation or the like and a voltage is then applied upon an insulation film of the MOS capacitor to thereby apply electric stress, a voltage which develops upon dielectric breakdown of the insulation film is measured, a chip which is at or below a certain threshold voltage (which is 8 MV/cm for instance) is identified as a defect, and a ratio of failing capacitors (destruction of the gate oxide film) is calculated. A process condition is set such that the antenna-mounted MOS capacitor will not be destroyed.

However, the conventional antenna-mounted MOS capacitor for charge-up damage evaluation described above has a problem that while it has high sensitivity to damage upon the thin-film gate oxide film 102 attributed to direct charging with electric charges associated with ion implantation, plasma etching, an electron ray and the like, the sensitivity to static electricity developed by frictions and the like is low. During ion implantation, etc., a large electric field is applied upon the antenna electrode. When the applied electric field is uneven, the applied electric field makes a current flow in the thin-film gate oxide film 102. Since a large amount of electric charges pass through the thin-film gate oxide film 102 at this stage, the thin-film gate oxide film 102 is destroyed.

Although a large electric field is applied upon the antenna electrode because of static electricity which develops by frictions between insulation members or the like, the amount of electric charges is extremely small, and hence, there will be no flow of electric charges (current) which is large enough to destroy the thin-film gate oxide film 102. For this reason, the sensitivity of the conventional antenna-mounted MOS capacitor to charge-up damage owing to static electricity is low.

SUMMARY OF THE INVENTION

The present invention solves the problems with the conventional techniques described above, and aims at providing a semiconductor device for charge-up damage evaluation and a charge-up damage evaluation method with which it is possible to detect charge-up damage which is caused by static electricity.

A semiconductor device for charge-up damage evaluation according to the present invention comprises: a substrate; a first insulation film formed on the substrate; a first conductive layer formed on the first insulation film and connected with the substrate; a second insulation film formed on the first conductive layer; a second conductive layer formed on the second insulation film and serving as an antenna; and a third insulation film formed on the second conductive layer.

In the structure above, the top-most conductive layer is covered with the insulation film and there are at least two conductive layers or more, the first conductive layer is disposed which is connected with the substrate, the second conductive layer is disposed which is connected with the large size pattern which will serve as an antenna, the first insulation film is disposed between the silicon substrate and the first inter-layer insulation film, and the second insulation film is disposed between the first conductive layer and the second inter-layer insulation film, and therefore, the sensitivity to charge-up caused by static electricity is high. That is, static electricity developing during processing at a manufacturing step causes electrostatic energy to accumulate owing to electric charges in a lower portion of the second conductive layer which will serve as an antenna, and application of a high electric field attributed to static electricity deteriorates the insulation film which is between the first conductive layer and the second conductive layer, whereby the accumulated electrostatic energy is released, the insulation film which is between the first conductive layer and the second conductive layer gets physically destroyed, and charge-up damage attributed to static electricity is therefore quantitatively detected at excellent sensitivity.

In the structure above, the third insulation film is of a material which is easily charged up. One can expect high sensitivity from this structure.

In the structure above, the third insulation film comprises convex and concave portions. This structure makes charging up easy.

In the structure above, geometric patterns are formed at least on the third insulation film which is located above the second conductive layer.

In the structure above, a top surface of the third insulation film has a slit-like shape with a number of parallel slits.

In the structure above, a number of slits are formed in an upper portion of the third insulation film in a radial arrangement.

In the structure above, a slit is formed in a spiral shape in an upper portion of the third insulation film.

In the structure above, a ratio of the surface area size of an antenna portion connected with the second conductive layer to that of a capacitor portion formed by the first conductive layer and the second conductive layer is high. In this structure, the sensitivity to charge-up damage which is caused by static electricity is high.

In the structure above, a ratio of the film thickness of the first insulation film to that of the second insulation film is high. In this structure, a large voltage is applied owing to static electricity.

A charge-up damage evaluation method according to the present invention is characterized in inspecting, using an optical detect inspection apparatus, the semiconductor device for charge-up damage evaluation described above charged up by static electricity at a semiconductor manufacturing step, and calculating a defect occurrence rate from the number of detected defects attributed to static electricity.

In the structure above, a physically destroyed place within an evaluation semiconductor device which has high sensitivity to static electricity is detected and a defect occurrence rate is then calculated, and hence, it is possible to quantitatively evaluate charge-up damage attributed to static electricity at excellent sensitivity.

Further, the charge-up damage evaluation method according to the present invention is a charge-up damage evaluation method in which the semiconductor device for charge-up damage evaluation described above is inspected using an optical detect inspection apparatus and a defect occurrence rate is calculated from the number of detected defects attributed to static electricity, wherein at the time of pulling up a semiconductor manufacturing apparatus for charge-up damage evaluation out from a cleaning liquid at a cleaning step among semiconductor manufacturing steps, pulling-up in a direction parallel to the slits formed in the upper portion of the third insulation film is performed separately from pulling-up in a direction perpendicular to the slits and the semiconductor manufacturing apparatus for charge-up damage evaluation thus pulled up is inspected using the optical detect inspection apparatus.

The structure above allows to measure charge-up damage which is dependent upon the direction of the semiconductor device separately for the direction parallel to the pulling-up direction and the direction perpendicular to the pulling-up direction, and to quantitatively evaluate charge-up damage for each.

DETAILED DESCRIPTION OF THE PREFERRED EMBODIMENTS

Preferred embodiments will now be described with reference to associated drawings, as a semiconductor device for charge-up damage evaluation and a method of evaluating charge-up damage according to the present invention.

<First Preferred Embodiment>

A semiconductor device for charge-up damage evaluation according to a first preferred embodiment of the present invention will now be described with reference to FIGS. 1 through 5.

Figure 1A:
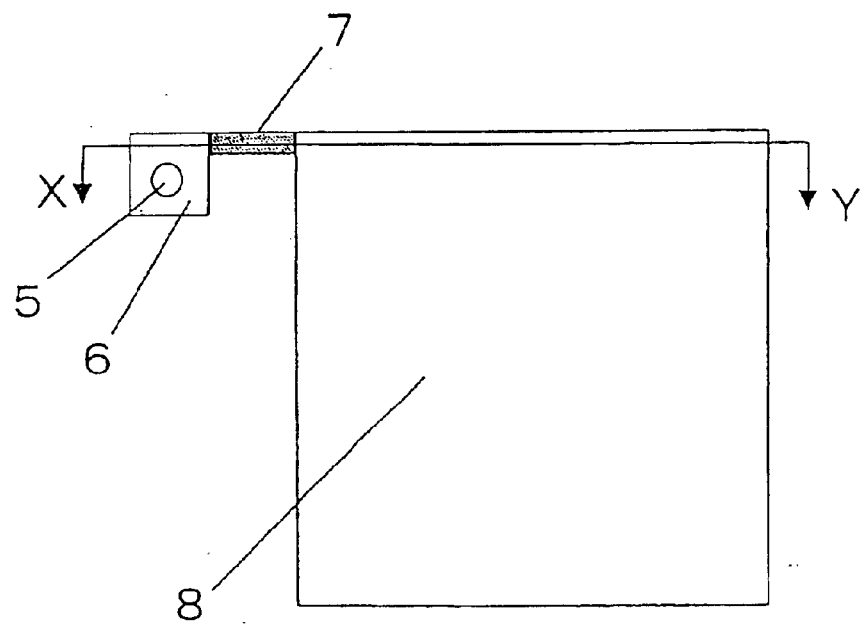
FIG. 1A is a surface view which shows a surface structure of a semiconductor device for charge-up damage evaluation according to the present invention.
Figure 1B:
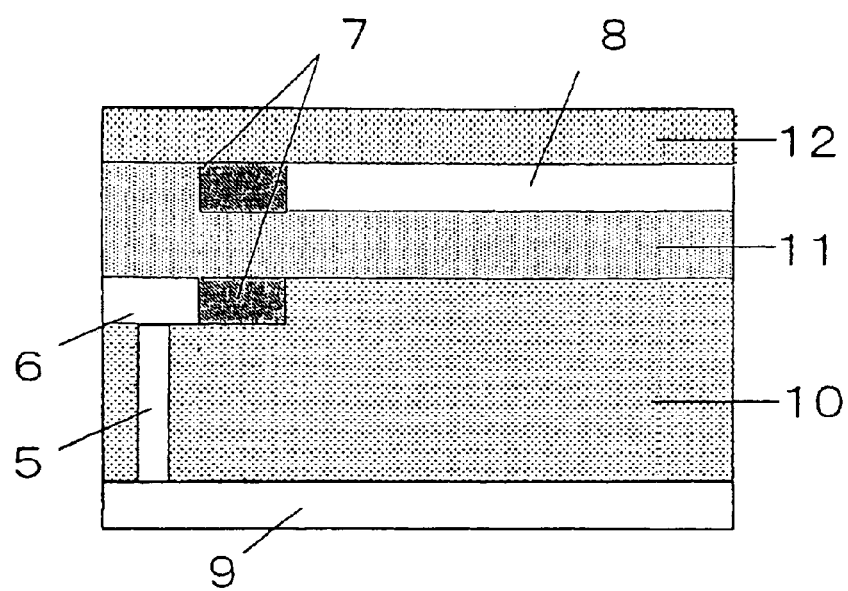
FIG. 1B is a drawing which shows the cross section taken along X-Y in FIG. 1A.

FIG. 1A shows a surface structure of a semiconductor device for charge-up damage evaluation (hereinafter referred to as a "test device") according to a preferred embodiment of the present invention, and FIG. 1B is a drawing of the cross section taken along X-Y in FIG. 1A. Denoted at 5 is a contact which electrically connects a silicon (Si) substrate 9 and a lower electrode 6, denoted at 8 is an upper electrode which defines a large size pattern which will serve as an antenna for accumulating electric charges, denoted at 7 are overlap portions where the lower electrode 6 and the upper electrode 8 overlap each other, denoted at 10 is an inter-layer insulation film deposited on the silicon substrate 9, denoted at 11 is an inter-layer insulation film deposited on the inter-layer insulation film 10, and denoted at 12 is an inter-layer insulation film deposited on the inter-layer insulation film 11. As the insulation film 12, a material which is easily charged up such as a plasma TEOS film and a plasma oxide film is used.

A place within this test device where charge-up owing to static electricity is detected (hereinafter referred to as a "detection portion") is the inter-layer insulation film 11 located at capacitor portions (detection portions) 7 in which the upper electrode 8 which will serve as an antenna for accumulating electric charges (hereinafter referred to as an "antenna portion") intersects the lower electrode 6 which is connected to the silicon substrate. A ratio of the surface area size of the detection portions 7 to that of the antenna portion 8 needs be large. For instance, the surface area size of the detection portions 7 may be 10 $\mu$m$^2$ and a ratio of the surface area size of the detection portion to that of the antenna portion may be 1000000. Further, the insulation film thickness may be thicker than that of a conventional antenna-mounted MOS capacitor. For example, in the preferred embodiment, the film thickness of the inter-layer insulation film 11 is 400 nm, the film thickness of the inter-layer insulation film 10 is 400 nm, and plasma TEOS (Tetra Ethyl Ortho Silicate) whose relative dielectric constant is 4.2 is used as the inter-layer insulation films. By means of such a structure, the inter-layer insulation film which is subject to detection gets destroyed even with a very small amount of charging caused by static electricity which is as low as $3.0 \times 10^{-3}$ C/m$^2$ per unit surface area, which allows to detect static electricity at high sensitivity.

The reason why the structure above permits to detect charging caused by static electricity at good sensitivity will now be described.

When a surface of the test device is charged up by static electricity, a surface potential increases. In accordance with the increase of the potential, the capacitor formed by the antenna portion 8 accumulates electrostatic energy. As the surface potential becomes equal to or larger than a certain constant value, an electric field which is equal to or beyond a withstand voltage is applied upon the inter-layer insulation film 11 located at the detection portions 7. Due to the applied electric field equal to or beyond the withstand voltage, a leak current develops between the electrodes at the detection portions 7. Once a flow of electric charges is created by the leak current, the electric charges accumulated between the upper electrode 8 which will serve as an antenna and the inter-layer insulation film 11 rush toward the silicon substrate 9 en masse. The accumulated electric charges thus abruptly released and the flow of the electric charges give rise to Joule heat which then physically destroys the inter-layer insulation film 11 located at the detection portions 7.

Figure 2:
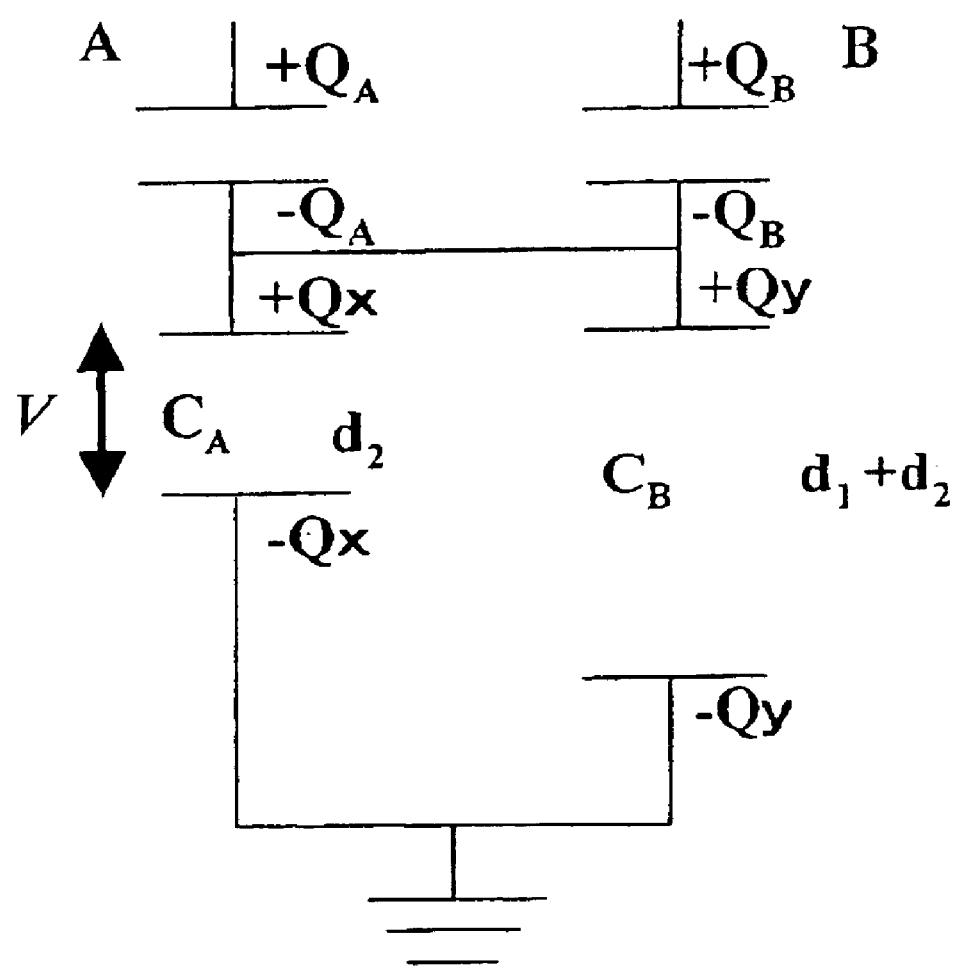
FIG. 2 is an explanatory diagram which shows an equivalent circuit in FIG. 1B at the time that a semiconductor manufacturing apparatus charges up the top-most surface of the semiconductor device for charge-up damage evaluation according to the present invention.

FIG. 2 shows an equivalent circuit in FIG. 1B at the time of charging up of the top-most surface of the test device. Assuming that the dielectric constant in vacuum is $\epsilon_0$ and the relative dielectric constant of the inter-layer insulation films 10 and 11 is k, in FIG. 3, electrostatic energy E owing to electric charges accumulated between the upper electrode 8 and the inter-layer insulation film 11, electrostatic capacities $C_A$ and $C_B$ and an applied voltage V are expressed as below:

$$E = \frac{1}{2}\frac{(Q_A + Q_B)^2}{C_A + C_B} = \frac{1}{2}(C_A + C_B)V^2 \qquad (1)$$

$$C_A = K\epsilon_0 \frac{S_A}{d_2} \qquad (2)$$

$$C_B = K\epsilon_0 \frac{S_B}{d_1 + d_2} \qquad (3)$$

$$V = \frac{Q_A + Q_B}{C_A + C_B} \qquad (4)$$

where $C_A$ denotes the electrostatic capacity of the inter-layer insulation film 11 located at the detection portions 7 in which the upper electrode 8 overlaps the lower electrode 6 (the relative dielectric constant: k, the insulation film thickness: $d_2$, the electrode surface area size: $S_A$, the amount of accumulated electric charges: $Q_X$), $Q_A$ denotes the amount of electric charges accumulated at the top-most surface of the inter-layer insulation film 12 which is on the upper electrode 8 located at the portions 7, $C_B$ denotes the electrostatic capacity of the insulation film which is formed by the inter-layer insulation films 10 and 11 which are between the upper electrode 8 and the Si substrate 9 (the relative dielectric constant: k, the insulation film thickness: $d_1 + d_2$, the electrode surface area size: $S_B$, the amount of accumulated electric charges: $Q_Y$), $Q_B$ denotes the amount of electric charges accumulated at the top-most surface of the inter-layer insulation film 12 which is on the upper electrode 8 and V denotes a voltage applied between the upper electrode 8 and the inter-layer insulation film 11.

To ensure destruction by a smaller amount of charging at the test device surface than generated static electricity permits detection of charge-up at better sensitivity.

For the inter-layer insulation film 11 between the upper electrode 8 and the detection portions 7 to be destroyed, it is necessary that an electric field equal to or beyond the withstand voltage develops and that electrostatic energy (E) by electric charges accumulated between the upper electrode 8 and the inter-layer insulation film 11 builds up to an extent sufficient enough to destroy the inter-layer insulation film 11 located at the detection portions 7 before the electric field applied upon the insulation film which is to be destroyed gives rise to a leak current. A value ($S_B/S_A$) obtained by dividing the surface area size of the antenna portion 8 by that of the detection portions 7 will be hereinafter referred to as an antenna ratio (AR).

In order to cause destruction at better sensitivity relative to generated static electricity, the surface area size of the antenna portion 8 ($S_B$) which is for making it easy to secure charging which would be otherwise less must be large to thereby increase electrostatic energy (E) which is caused by thus accumulated electric charges, the film thickness ($d_2$) of the subject insulation film 11 must be large so that the accumulated electric charges will not instantly leaked out and lost, the lower electrode 6 must be connected with the Si substrate 9 to thereby increase a voltage which is applied upon the subject insulation film 11, and the film thickness ($d_1$) of the inter-layer insulation film 10 must be thick.

Figure 3:
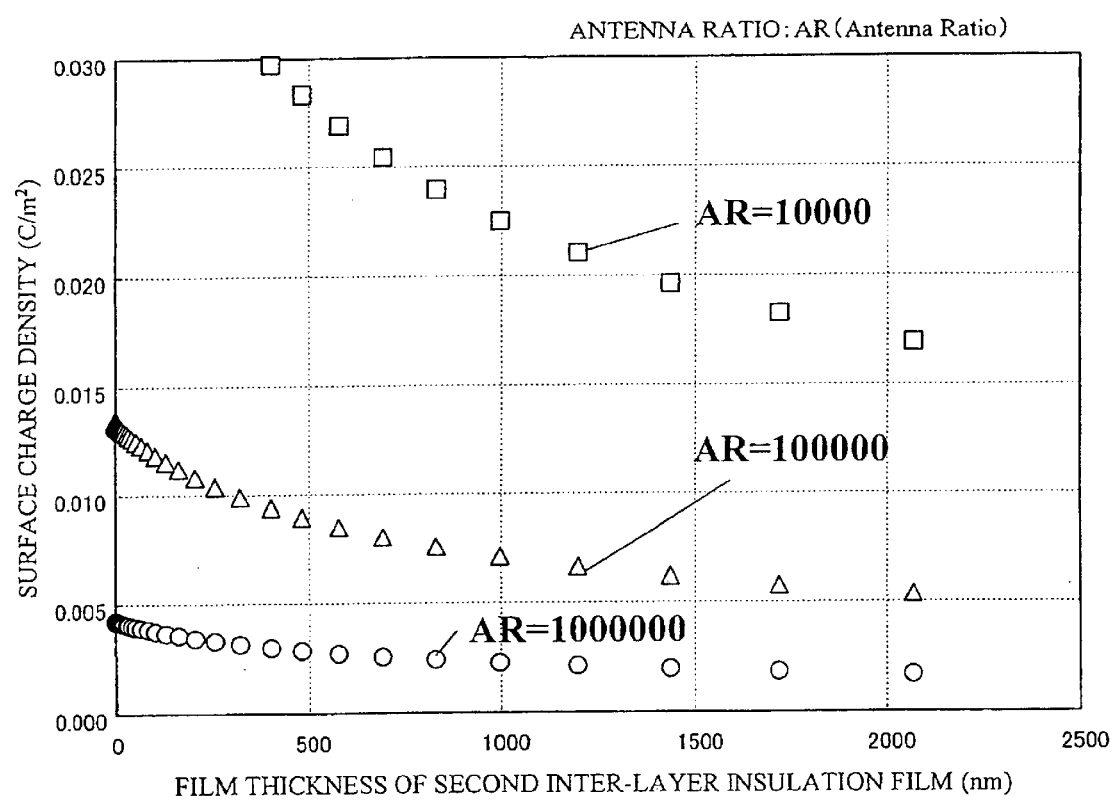
FIG. 3 is a drawing which shows how the density of electric charges charged up at a test device surface by static electricity correlates, at different antenna ratios, to the film thickness (nm) of an inter-layer insulation film 11 deposited on an inter-layer insulation film 10.

FIG. 3 shows the result of a calculation on how the density (C/m$^2$) of electric charges charged up at the test device surface which is enough to destroy the detection portions 7 by means of static electricity correlates to the film thickness ($d_2$: nm) of the inter-layer insulation film 11 which is deposited on the inter-layer insulation film 10 and dependent upon the values $C_A$ and $C_B$. In FIG. 3, the horizontal axis expresses the film thickness ($d_2$) of the inter-layer insulation film 11 and the vertical axis expresses the density (C/m$^2$) of electric charges charged up at the test device surface by static electricity. From FIG. 3, it is understood that the larger the antenna ratio is and the thicker the film thickness of the inter-layer insulation film 11 is, the lower the density of electric charges is at which electrostatic energy builds up sufficiently to destroy the inter-layer insulation film 11 located at the detection portions.

Figure 4:
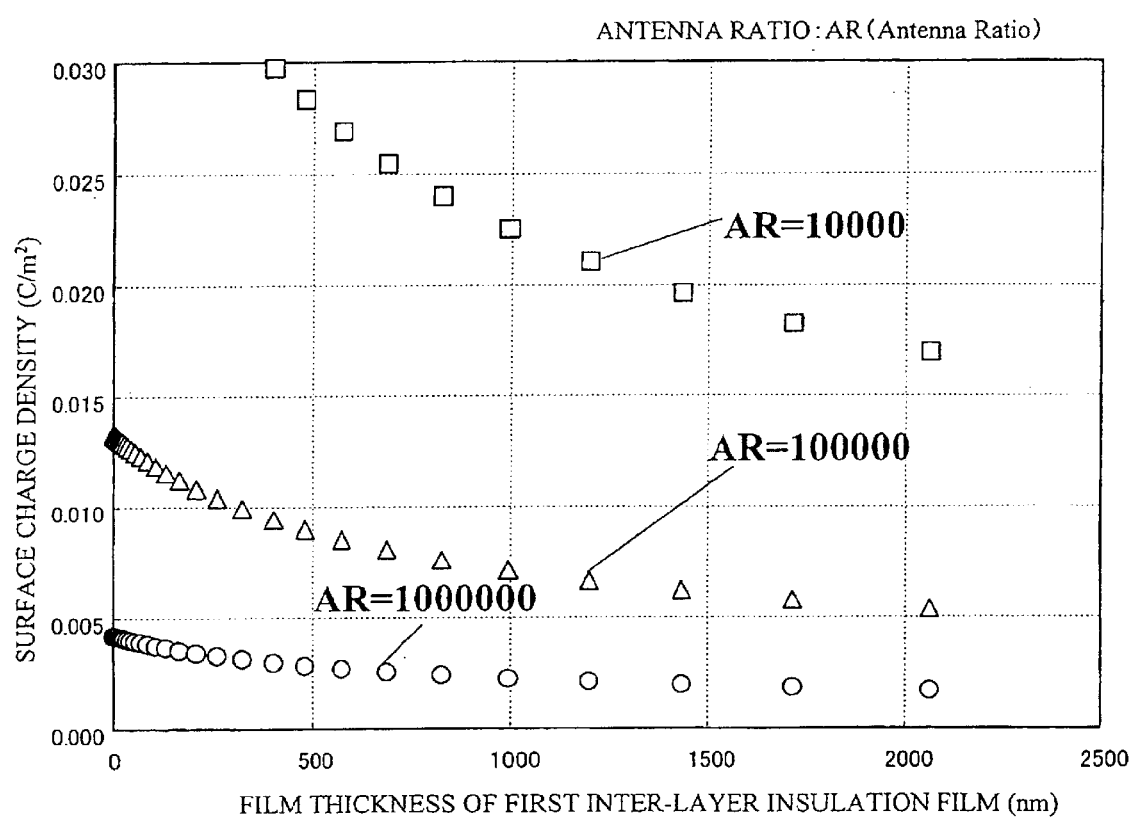
FIG. 4 is a drawing which shows how the density of electric charges charged up at the test device surface by static electricity correlates to the film thickness (nm) of the inter-layer insulation film 10 at different antenna ratios.

Meanwhile, FIG. 4 shows the result of a calculation on how the density ($C/m^2$) of electric charges charged up at the test device surface which is enough to destroy the detection portions 7 by means of static electricity correlates to the film thickness ($d_1$: nm) of the inter-layer insulation film 10 which is deposited on the silicon substrate 9. The film thickness ($d^2$) of the inter-layer insulation film 11 however is fixed at 400 nm. In FIG. 4, the horizontal axis expresses the film thickness of the inter-layer insulation film 10 which is deposited on the Si substrate 9 and the vertical axis expresses the density ($C/m^2$) of electric charges charged up at the test device surface by static electricity. From FIG. 4, it is seen that the larger the antenna ratio is and the thicker the film thickness of the inter-layer insulation film 10 is, i.e., the larger the ratio of the film thickness of the first insulation film 10 to that of the second insulation film 11 is, the lower the density of electric charges is at which electrostatic energy builds up sufficiently to destroy the inter-layer insulation film 11 located at the detection portions 7.

Figure 5:
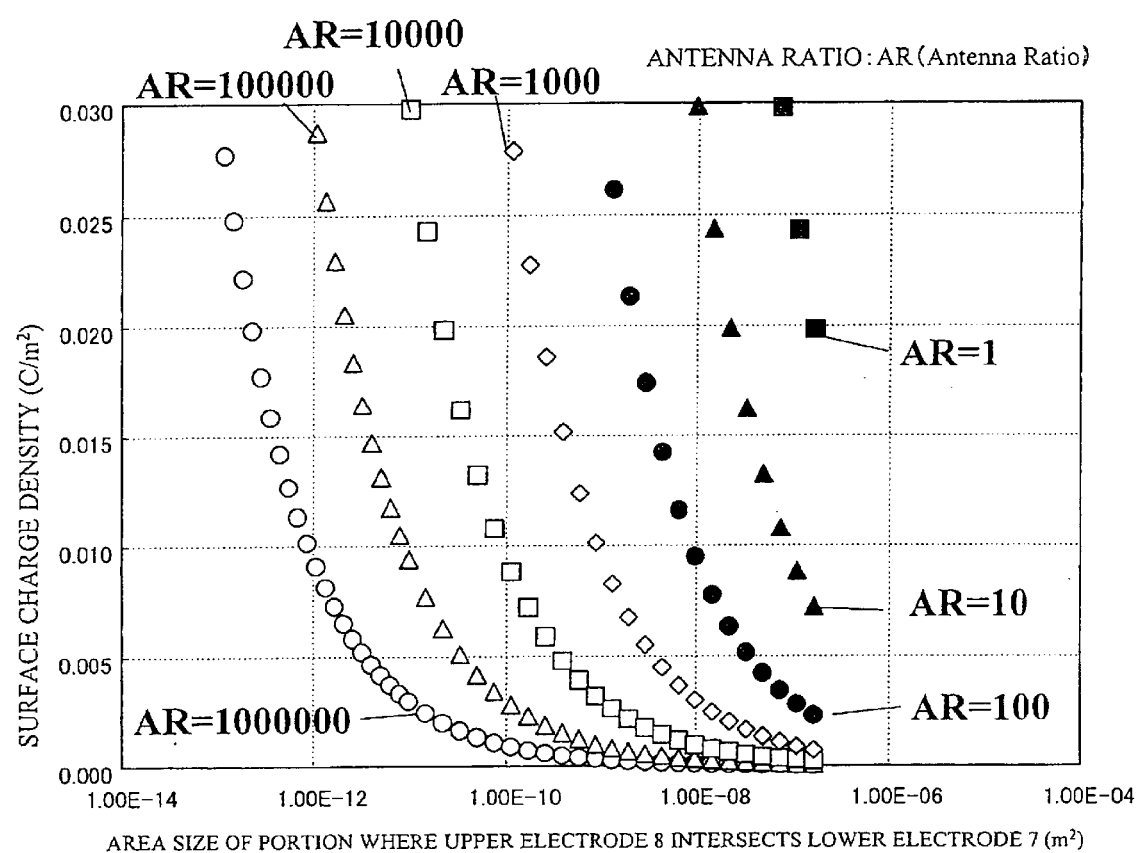
FIG. 5 is a drawing which shows how the density of electric charges charged up at the test device surface by static electricity correlates to the surface area size of overlap portions 7, where an upper electrode 8 overlaps a lower electrode 6 which is connected to an Si substrate, at different antenna ratios.
Figure 6:
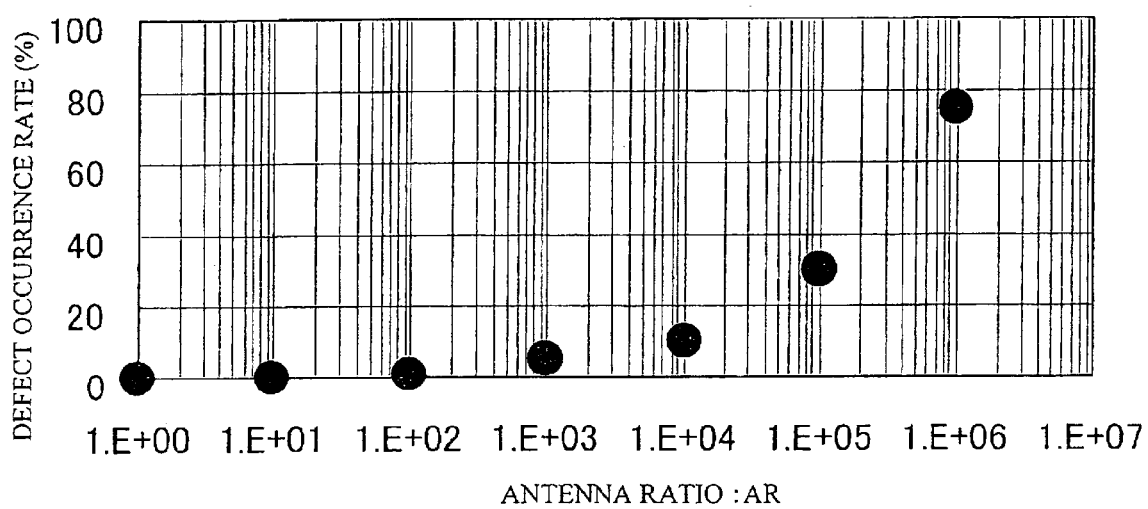
FIG. 6 is a drawing of a correlation to an antenna ratio, which shows a result on a defect occurrence rate calculated from the number of defects which are detected using an optical detect inspection apparatus within the semiconductor device for charge-up damage evaluation according to the present invention.
Figure 7:
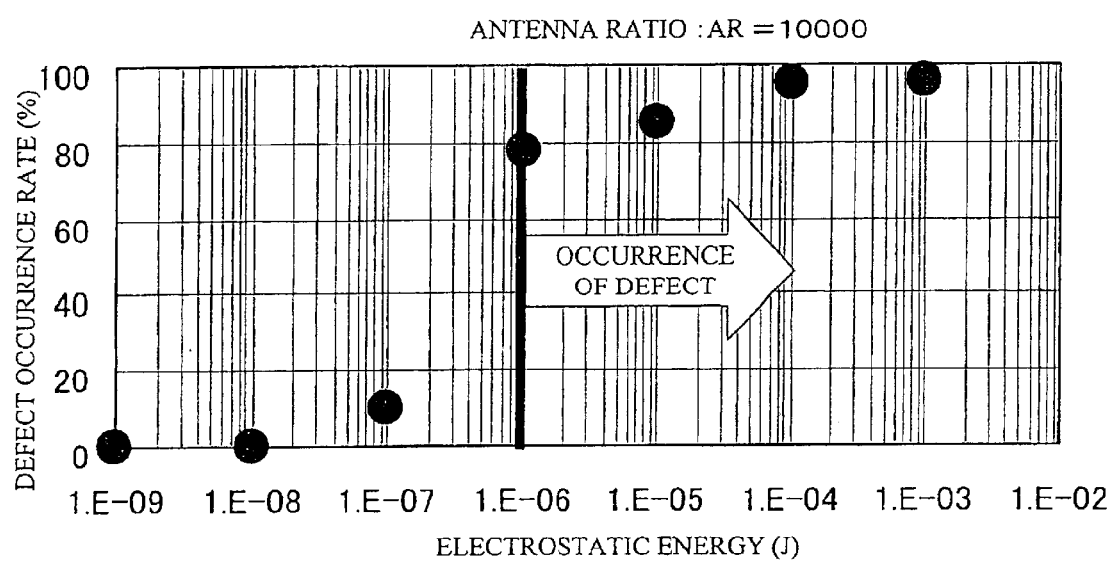
FIG. 7 is a drawing of a correlation between a defect occurrence rate and electrostatic energy (J) developed by electric charges which accumulate between the upper electrode 8, which serves as an antenna, and the inter-layer insulation film 11.

Further, FIG. 5 shows the result of a calculation on how the density ($C/m^2$) of electric charges charged up at the test device surface by static electricity correlates to the surface area size of the detection portions 7 which affects the value $C_A$. In FIG. 5, the horizontal axis expresses the surface area size of the detection portions 7 (The numerical values along the horizontal axis in FIG. 5, e.g., 1.00E-08 means $1 \times 10^{-8}$. The numerical values along the horizontal axes in FIGS. 6 and 7 are similar.) and the vertical axis expresses the density ($C/m^2$) of electric charges charged up at the test device surface by static electricity. From FIG. 5, it is seen that the larger the antenna ratio is and the larger the surface area size of the detection portions is, the lower the density of electric charges is at which electrostatic energy builds up sufficiently to destroy the inter-layer insulation film 11 located at the detection portions.

The results above show that for the test device to be destroyed at better sensitivity relative to charging up attributed to static electricity, the antenna ratio may be 100000 or higher, the inter-layer insulation films 10 and 11 maybe 400 nm or thicker, and the surface area size of the overlap portions 7 in which the upper electrode 8 overlaps the lower electrode 6 may be 10 $\mu m^2$ or larger. When these conditions are met, the test device exhibits higher sensitivity to charging up caused by static electricity than a conventional antenna-mounted MOS capacitor and makes it easier to detect charge-up.

A method of evaluating charge-up damage according to the first preferred embodiment of the present invention will now be described.

In a semiconductor manufacturing apparatus which one wishes to evaluate as for charge-up damage, the test device described above which is highly sensitive to charging attributed to static electricity is processed. During processing with the semiconductor manufacturing apparatus which is subject to evaluation, when static electricity develops and electric charges on the test device surface are charged up to or beyond a certain value, the charge-up detection portions of the test device get destroyed.

The test device including the destroyed portions is loaded into the optical detect inspection apparatus and the chip is partitioned by antenna ratio, thereby defining inspection areas. For instance, in the event that there are three types of antenna ratios of 1, 10 and 100, inspection areas are defined such that those areas where the antenna ratio is 1 will be inspected during a test 1, those areas where the antenna ratio is 10 will be inspected during a test 2 and those areas where the antenna ratio is 100 will be inspected during a test 3. In addition, destruction only in the charge-up detection portions is detected, thereby adjusting the sensitivity so that foreign matters such as particles will not be detected. Owing to such setup, it is possible to detect the number of only such defects which are caused by destruction in the charge-up detection portions for each antenna ratio. With defect inspection run after setting these up, an occurrence rate of defects in the test device is calculated for each antenna ratio based on the number of thus detected defects.

An example of evaluation of charge-up damage attributed to static electricity using the structure according to the first preferred embodiment will now be described.

From the formula (1), it is seen that electrostatic energy developing from accumulated electric charges grows as the amount of accumulated electric charges increases. Hence, an increase of the surface area size of the upper electrode 8 serving as an antenna and an increase of the amount of accumulated electric charges give rise to charge-up damage at excellent sensitivity. An experiment was conducted on a test device in which the total of seven types of the structure shown in FIG. 1A are arranged within one chip to thereby obtain antenna ratios of 1, 10, 100, 1000, 10000, 100000 and 1000000, where the film type of the inter-layer insulation film 10 deposited on the silicon substrate 9 and the inter-layer insulation film 11 deposited on the inter-layer insulation film 10 is a plasma TEOS film (the relative dielectric constant: 4.2), the film thickness is 400 nm and the surface area size of the overlap portions 7 in which the upper electrode 8 serving as the detection portions overlaps the lower electrode 6 has a constant value (=10 $\mu m^2$). The test device was processed using a semiconductor manufacturing apparatus for charge-up damage evaluation. Defects owing to charge-up caused by static electricity were detected using an optical detect inspection apparatus, and an occurrence rate of defects was calculated from the number of these defects. FIG. 6 shows the result. In FIG. 6, the horizontal axis expresses the antenna ratio within the test device and the vertical axis expresses the defect occurrence rate (%). From FIG. 6, it is seen that the defect occurrence rate increases as the antenna ratio increases. Meanwhile, FIG. 7 shows a correlation between the defect occurrence rate and electrostatic energy developing from electric charges accumulated between the upper electrode 8 which is the antenna portion and the inter-layer insulation film 11, calculated from the formulae (1), (2), (3) and (4) at the antenna ratio of 10000. In FIG. 7, the horizontal axis expresses electrostatic energy (J) developing from electric charges accumulated between the upper electrode 8 serving as the antenna and the inter-layer insulation film 11, whereas the vertical axis expresses the defect occurrence rate (%). From FIG. 7, it is seen that the defect occurrence rate dramatically increases as electrostatic energy becomes equal to or larger than 1.0 $\mu J$.

As described above, according to this preferred embodiment, on a test device in which the antenna ratio is large and the sensitivity of detecting charge-up is enhanced, destruction caused by charge-up is detected using an optical detect inspection apparatus, and therefore, charge-up damage owing to static electricity is quantitatively evaluated.

<Second Preferred Embodiment>

Figure 8A:
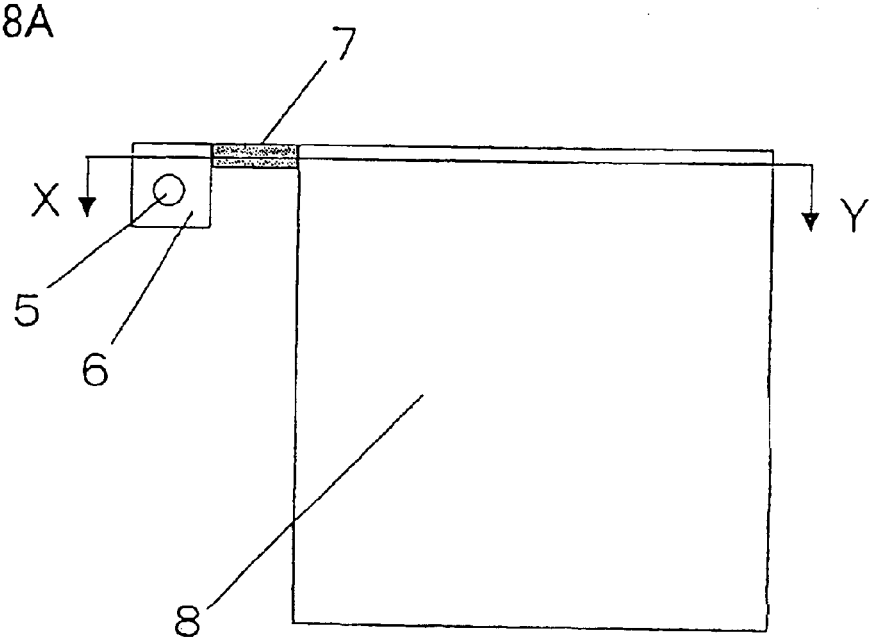
FIG. 8A is a surface view which shows a surface structure of a second semiconductor device for charge-up damage evaluation according to the present invention.
Figure 8B:
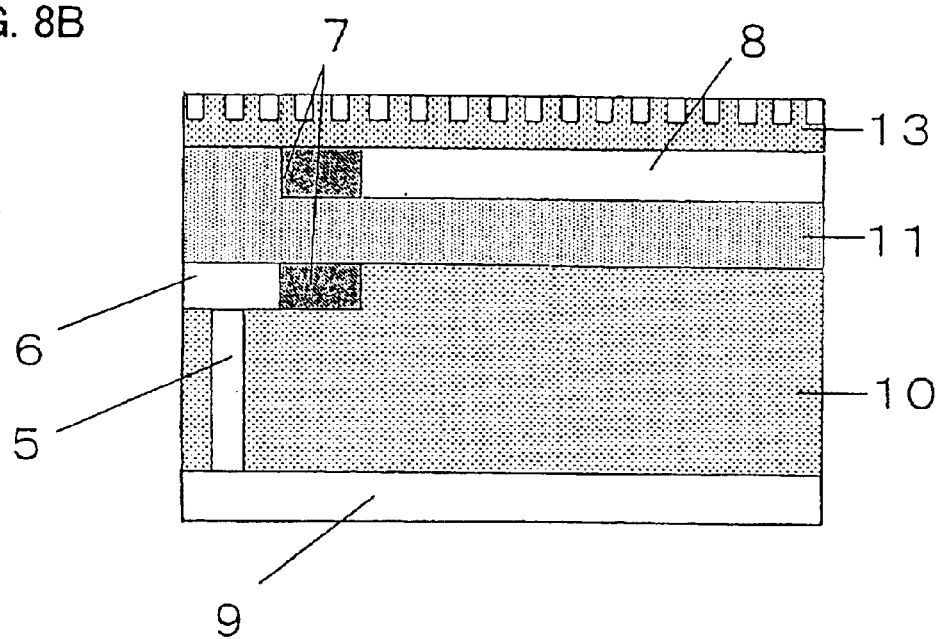
FIG. 8B is a drawing which shows a cross sectional structure taken along X-Y in FIG. 8A.

A semiconductor device for charge-up damage evaluation according to a second preferred embodiment of the present invention will now be described with reference to FIGS. 8 through 10. FIG. 8 is a structure drawing of the second semiconductor device for charge-up damage evaluation according to the present invention. Shown in FIG. 8A is a surface structure of a test device according to the second preferred embodiment, and FIG. 8B is a drawing which shows the cross section taken along X-Y in FIG. 8A.

Denoted at 5 is a contact which electrically connects a silicon substrate 9 and a lower electrode 6, denoted at 8 is an upper electrode which will serve as antenna for accumulating electric charges, denoted at 7 are overlap portions where the lower electrode 6 and the upper electrode 8 overlap each other, denoted at 10 is an inter-layer insulation film deposited on the silicon substrate 9, denoted at 11 is an inter-layer insulation film deposited on the inter-layer insulation film 10, and denoted at 13 is a top-most inter-layer insulation film which is deposited on the inter-layer insulation film 11 and which is shaped into a slit shape having a number of parallel slits (e.g., pitches: 1 μm) for instance.

Use of this structure allows to detect charge-up damage exhibiting directivity.

<Third Preferred Embodiment>

An example of measurement on charge-up using the semiconductor device for charge-up damage evaluation according to the second preferred embodiment will now be described. The evaluation method is the same as that described in relation to the first preferred embodiment.

Figure 9A:
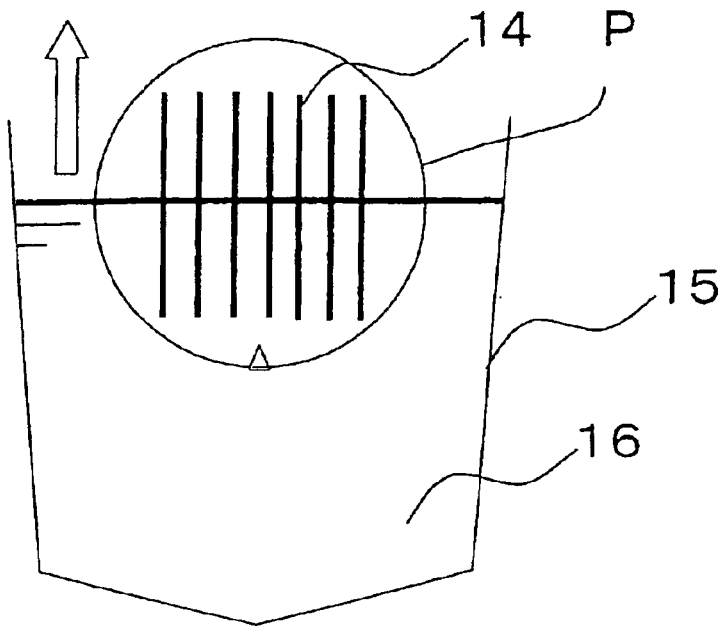
FIG. 9A is an explanatory diagram which shows a method of pulling up from a bath a semiconductor device for charge-up damage evaluation according to a third preferred embodiment of the present invention, in relation to a situation where the pulling-up direction is parallel to the direction of slits.
Figure 9B:
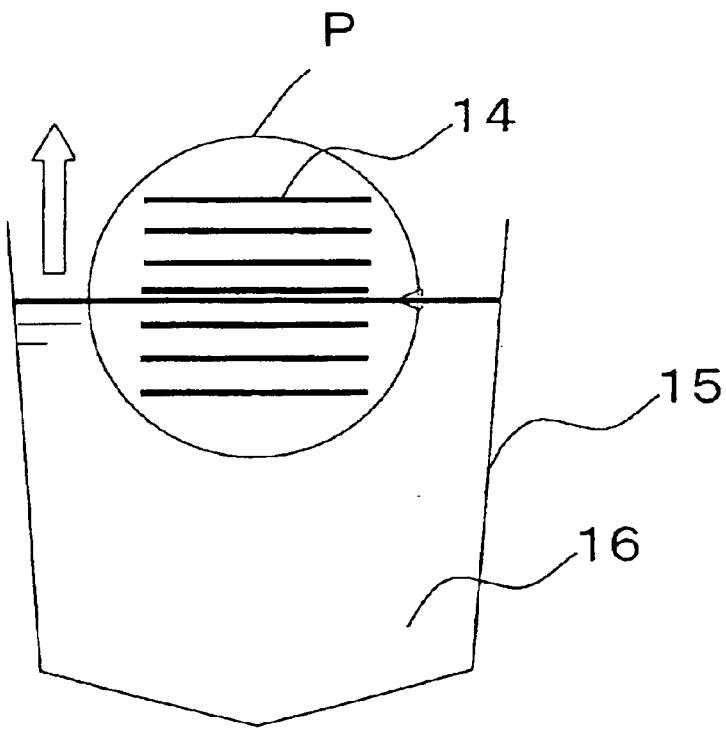
FIG. 9B is an explanatory diagram which represents a situation where the pulling-up direction is perpendicular to the direction of the slits.

FIG. 9 shows a method of pulling up a semiconductor device for charge-up damage evaluation P according to the present invention in a multi-bath immersion cleaning apparatus which uses ultrapure water for instance as a cleaning liquid. Shown in FIG. 9A is an instance that the pulling-up direction is parallel to the direction of slits 14, while shown in FIG. 9B is an instance that the pulling-up direction is perpendicular to the direction of the slits 14. FIG. 10 is a drawing which shows a relationship between a pulling-up speed (mm/s) along each direction and a destruction rate of the semiconductor device for charge-up damage evaluation according to the present invention. In FIG. 10, the horizontal axis expresses the pulling-up speed (mm/s) of pulling up the semiconductor device and the vertical axis expresses the defect occurrence rate (%). A quartz bath 15 is filled up with ultrapure water 16 (the specific resistance value: 18.0 MΩ·cm). The semiconductor device for charge-up damage evaluation according to the present invention is immersed in the ultrapure water 16 for two minutes and then pulled up using a lifter.

Figure 10:
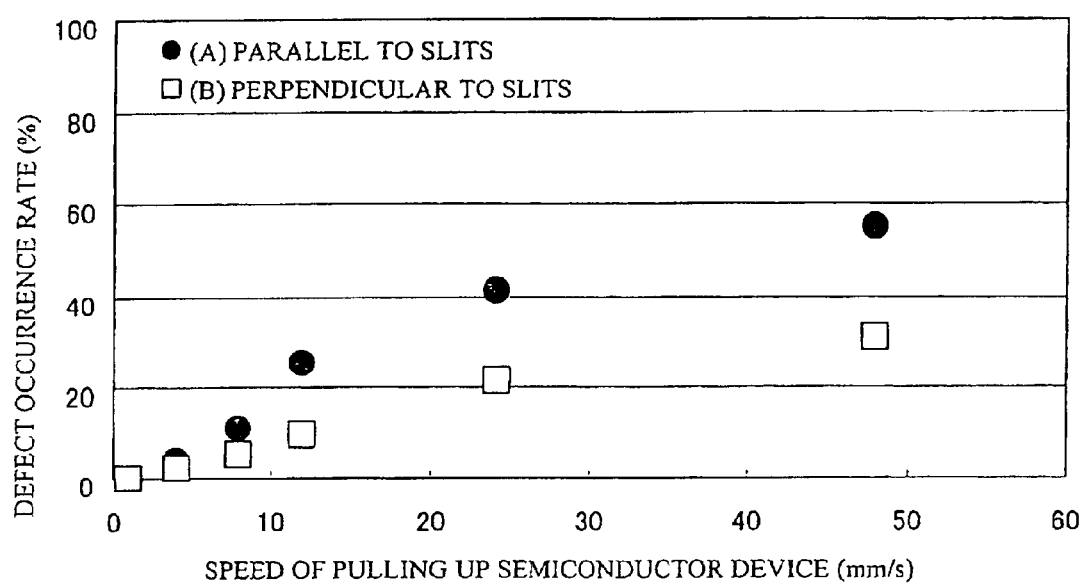
FIG. 10 is a relationship drawing which shows a relationship between an occurrence rate of defects attributed to charge-up damage in a semiconductor device and a speed of pulling up the semiconductor device out from a cleaning apparatus.
Figure 11:
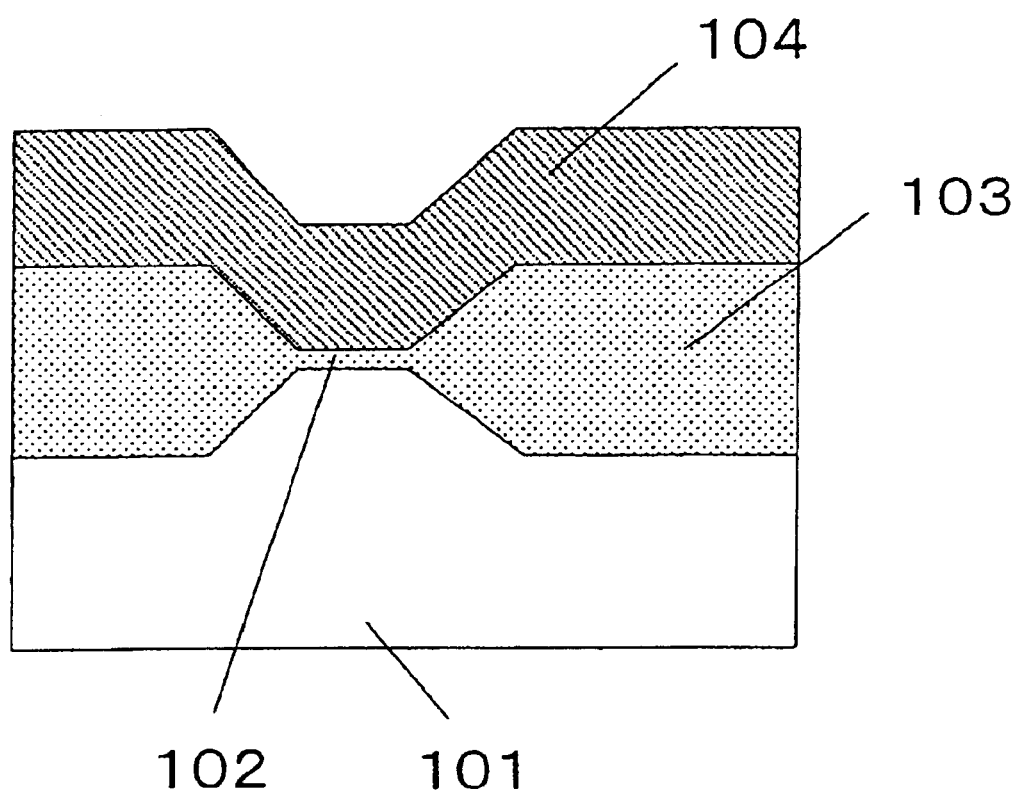
FIG. 11 is a drawing which shows a cross sectional structure of a conventional antenna-mounted MOS capacitor for charge-up damage evaluation.

From FIG. 10, it is seen that for both the situation shown in FIG. 9A and the situation shown in FIG. 9B, as the pulling-up speed increases, the defect occurrence rate also increases. It is believed to be because an increase of the pulling-up speed increases a load per unit time of frictional force F' which acts between a substrate and the ultrapure water 16 held in the quartz bath 15. It is in the situation shown in FIG. 9A where the pulling-up direction is parallel to the direction of the slits 14 that the ultrapure water 16 contacts with the substrate (P) in a wider area. In addition, since the ultrapure water 16, accelerated by gravity, easily flows between the slits 14, a load of the frictional force F' acting between the slits 14 and the ultrapure water is larger in the situation shown in FIG. 9A than in the situation shown in FIG. 9B.

Hence, the frictions develop static electricity, the amount of electric charges accumulated on the top-most inter-layer insulation film 13 having a slit shape also increases as the pulling-up speed increases, the voltage V upon the third insulation film 13 increases in proportion, and a destruction rate within the semiconductor device increases.

As described above, according to this preferred embodiment, the surface of the top-most inter-layer insulation film 13 of the semiconductor device according to the present invention is shaped as slits which are parallel to the pulling-up direction, the ultrapure water 16 contacts with the substrate (P) in a wider area, and the speed at which the ultrapure water 16 falls increases, thereby quantitatively evaluating charge-up damage owing to static electricity which builds up in accordance with frictions between the ultrapure water 16, which is an insulator, and the top-most inter-layer insulation film 13 which is shaped as slits.

This preferred embodiment is characterized in that it is possible to measure charge-up damage which is dependent upon the pulling-up direction of the semiconductor device, each for the direction parallel to the pulling-up direction and the direction perpendicular to the pulling-up direction.

When the slits of the top-most inter-layer insulation film 13 are shaped as a spiral, ultrapure water ejected out from a rotary single wafer-type cleaning apparatus contacts the top-most inter-layer insulation film 13 over a wider area, which in turn facilitates development of static electricity and enhances the sensitivity.

In the present invention, the third insulation film 13 may have convex and concave portions, and geometric patterns may be formed at least on the third insulation film 13 which is located above the second conductive layer 8. Further, a number of slits may be formed in an upper portion of the third insulation film 13 in a radial arrangement.

What is claimed is:

1. A semiconductor device for charge-up damage evaluation, comprising:

a substrate;

a first insulation film formed on said substrate;

a first conductive layer formed on said first insulation film and connected with said substrate;

a second insulation film formed on said first conductive layer;

a second conductive layer formed on said second insulation film and serving as an antenna; and a third insulation film formed on said second conductive layer.

2. The semiconductor device for charge-up damage evaluation of claim 1, wherein said third insulation film is of a material which is easily charged up.

3. The semiconductor device for charge-up damage evaluation of claim 1, wherein said third insulation film comprises convex and concave portions.

4. The semiconductor device for charge-up damage evaluation of claim 1, wherein geometric patterns are formed at least on said third insulation film which is located above said second conductive layer.

5. The semiconductor device for charge-up damage evaluation of claim 1, wherein a top surface of said third insulation film has a slit-like shape with a number of parallel slits.

6. The semiconductor device for charge-up damage evaluation of claim 1, wherein a number of slits are formed in an upper portion of said third insulation film in a radial arrangement.

7. The semiconductor device for charge-up damage evaluation of claim 1, wherein a slit is formed in a spiral shape in an upper portion of said third insulation film.

8. The semiconductor device for charge-up damage evaluation of claim 1, wherein a ratio of the surface area size of an antenna portion connected with said second conductive layer to that of a capacitor portion formed by said first conductive layer and said second conductive layer is high.

9. The semiconductor device for charge-up damage evaluation of claim 1, wherein a ratio of the film thickness of said first insulation film to that of said insulation film layer is high.

10. A charge-up damage evaluation method characterized in inspecting, using an optical detect inspection apparatus, the semiconductor device for charge-up damage evaluation of claim 1, 2, 3, 4, 5, 6, 7, 8 or 9 charged up by static electricity at a semiconductor manufacturing step, and calculating a defect occurrence rate from the number of detected defects attributed to static electricity.

11. A charge-up damage evaluation method in which the semiconductor device for charge-up damage evaluation of claim 5 is inspected using an optical detect inspection apparatus and a defect occurrence rate is calculated from the number of detected defects attributed to static electricity, wherein at the time of pulling up a semiconductor manufacturing apparatus for charge-up damage evaluation out from a cleaning liquid at a cleaning step among semiconductor manufacturing steps, pulling-up in a direction parallel to said slits formed in said upper portion of said third insulation film is performed separately from pulling-up in a direction perpendicular to said slits and the semiconductor manufacturing apparatus for charge-up damage evaluation thus pulled up is inspected using said optical detect inspection apparatus.

* * * * *